(12) United States Patent
Koshizuka

(10) Patent No.: US 8,213,258 B2
(45) Date of Patent: *Jul. 3, 2012

(54) SYSTEM WITH CONTROLLER AND MEMORY

(75) Inventor: Atsuo Koshizuka, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/149,504

(22) Filed: May 31, 2011

(65) Prior Publication Data

US 2011/0228618 A1    Sep. 22, 2011

Related U.S. Application Data

(63) Continuation of application No. 12/710,481, filed on Feb. 23, 2010, now Pat. No. 7,965,581, which is a continuation of application No. 11/759,862, filed on Jun. 7, 2007, now Pat. No. 7,697,369.

(30) Foreign Application Priority Data

Jun. 8, 2006 (JP) ................... 2006-160204

(51) Int. Cl.
G11C 7/00 (2006.01)

(52) U.S. Cl. ................. 365/233.1; 365/189.05

(58) Field of Classification Search ............... 365/233.1, 365/189.05
See application file for complete search history.

(56) References Cited

U.S. PATENT DOCUMENTS

| | | | |
|---|---|---|---|
| 4,291,370 A * | 9/1981 | Charles | 710/305 |
| 4,615,017 A | 9/1986 | Finlay et al. | |
| 5,867,446 A * | 2/1999 | Konishi et al. | 365/233.16 |
| 6,023,430 A | 2/2000 | Izumikawa | |
| 6,094,434 A * | 7/2000 | Kotzur et al. | 370/401 |
| 6,098,109 A * | 8/2000 | Kotzur et al. | 709/249 |
| 6,223,265 B1* | 4/2001 | Kawasaki et al. | 711/167 |
| 6,396,768 B2* | 5/2002 | Ooishi | 365/193 |
| 6,789,209 B1* | 9/2004 | Suzuki et al. | 713/401 |
| 7,029,299 B1 | 4/2006 | Chen | |
| 7,237,073 B2 | 6/2007 | Jang | |
| 7,293,208 B2 | 11/2007 | Hobara | |
| 7,345,510 B1 | 3/2008 | Drapkin et al. | |
| 7,362,648 B2 | 4/2008 | Park et al. | |
| 7,558,933 B2 | 7/2009 | Sita | |
| 2002/0199055 A1 | 12/2002 | Wen | |
| 2006/0092721 A1 | 5/2006 | Lee | |
| 2007/0028027 A1* | 2/2007 | Janzen et al. | 711/5 |

FOREIGN PATENT DOCUMENTS

| | | |
|---|---|---|
| EP | 1494243 A | 1/2005 |
| JP | 2003-7069 A | 1/2003 |
| JP | 2005-025765 A | 1/2005 |
| JP | 2006-085851 A | 3/2006 |
| JP | 2006-120307 A | 5/2006 |
| JP | 2006-134334 A | 5/2006 |
| WO | 2005-033958 A1 | 4/2005 |

* cited by examiner

Primary Examiner — Michael Tran
(74) Attorney, Agent, or Firm — Sughrue Mion, PLLC

(57) ABSTRACT

According to the system of the present invention, data (DQ) signals are outputted/received between a controller 100 and a memory 200 based on a data strobe signal sent out from the controller 100. The data strobe signal is independently and completely separated from a clock signal. The data strobe signal has a frequency different from a clock signal. Therefore, the memory 200 is not required to generate a read data strobe signal from the clock signal nor to send the read data strobe signal in synchronization with the clock signal.

14 Claims, 16 Drawing Sheets

SYSTEM WITH CONTROLLER AND MEMORY

CROSS REFERENCE TO RELATED APPLICATIONS

This is a continuation of U.S. application Ser. No. 12/710,481 filed Feb. 23, 2010, which is a continuation of U.S. application Ser. No. 11/759,862 filed Jun. 7, 2007, which claims the benefit of priority from Japanese Patent Application No. 2006-160204, filed on Jun. 8, 2006 the contents of which are incorporated herein by reference.

BACKGROUND OF THE INVENTION

This invention relates to a system having a controller and a memory and, more particularly, to a data sending/receiving operation between the controller and the memory.

In a conventional data sending/receiving operation between the controller and the memory, either the controller or the memory who serves as a sender generates a data strobe signal which is synchronized with a clock signal. Data signals are sent out from the sender is synchronized with the data strobe signal as disclosed in U.S. Pat. No. 6,789,209B1, Description of the Related Art, the contents of U.S. Pat. No. 6,789,209B1 being incorporated herein by reference in their entireties.

U.S. Pat. No. 6,789,209B1 points out some problems on the use of the data strobe signal and, alternative to the data strobe signal, proposes a system which sends/receives the data in synchronization with the clock signal.

SUMMARY OF THE INVENTION

It is an object of the present invention to provide a system based on a new protocol which is different from the above-described conventional techniques.

One aspect of the present invention provides a system comprising a controller adapted to send out a first data strobe signal and a write data signal in a write operation. The write data signal is synchronized with the first data strobe signal. The controller is adapted, in a read operation, to send out a second data strobe signal and to receive a read data signal in synchronization with a read data strobe (RDQS) signal. The read data strobe signal corresponds to the second data strobe signal. The system also comprises a memory adapted to receive the write data signal in synchronization with the first data strobe signal in the write operation. The memory is adapted, in the read operation, to send out the read data strobe signal in response to the second data strobe signal and to send out the read data signal synchronized with the read data strobe signal.

The controller may be further adapted to produce a clock signal and to send the clock signal to the memory. Each of the first and the second data strobe signals and the read data strobe signal may be independent of and separated from the clock signal.

Each of the first and the second data strobe signals and the read data strobe signal may has a frequency different from the clock signal.

Each of the first and the second data strobe signals and the read data strobe signal may not be in synchronization with the clock signal.

Another aspect of the present invention provides a system wherein the memory comprises a low speed memory and a high speed memory. The controller sends out a clock signal having a clock frequency. The controller also sends out first and second lower data strobe signals as the first and the second data strobe signals for the low speed memory and receives lower read data strobe signal as the read data strobe signal from the low speed memory. Each of the first and the second lower data strobe signals and the lower read data strobe signal has a frequency equal to or lower than the clock frequency. The controller sends out first and second higher data strobe signals as the first and the second data strobe signals for the high speed memory and receives higher read data strobe signal as the read data strobe signal from the high speed memory. Each of the first and the second higher data strobe signals and the higher read data strobe signal has a frequency equal to or $2^n$ times (n being an integer) as the clock frequency.

An appreciation of the objectives of the present invention and a more complete understanding of its structure may be had by studying the following description of the preferred embodiment and by referring to the accompanying drawings.

Figure 1:
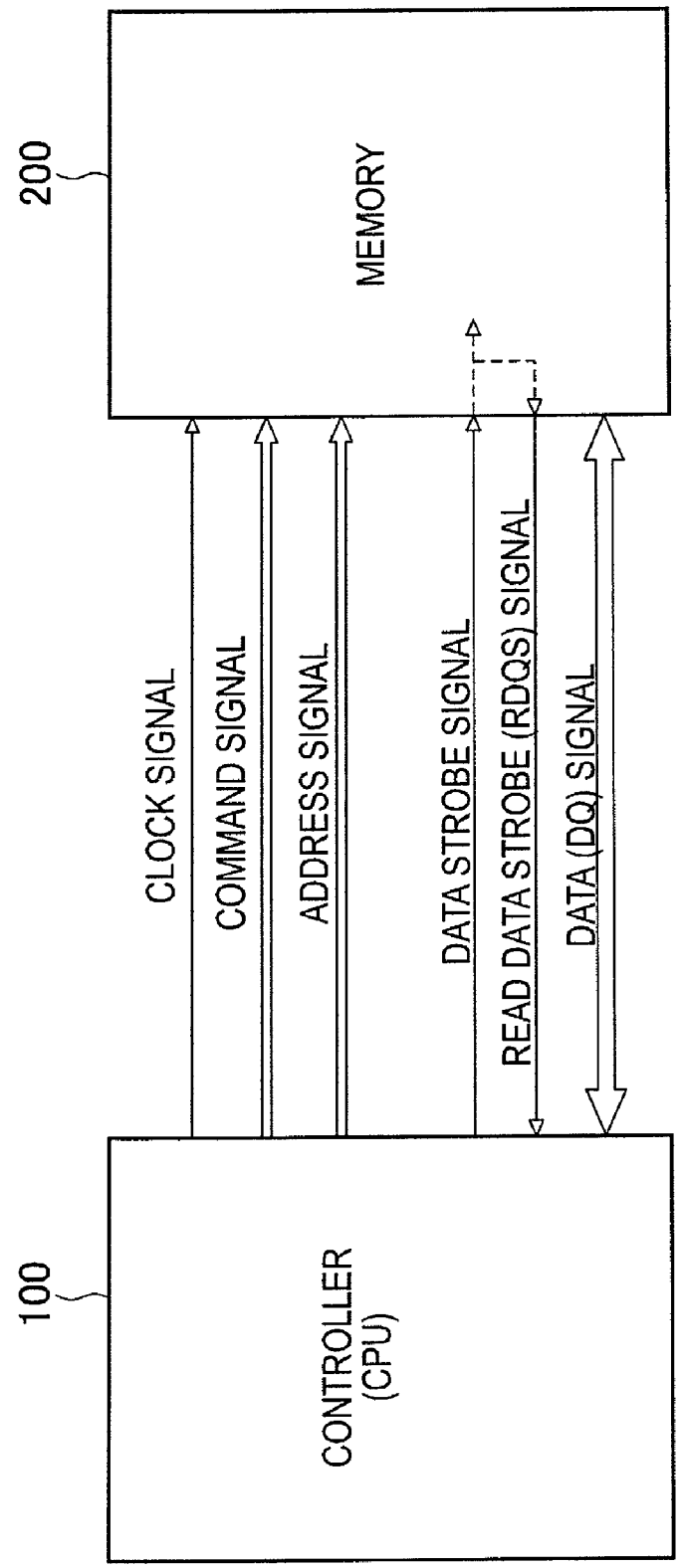
FIG. 1 is a schematic block diagram showing a structure of a system according to a first embodiment of the present invention.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DESCRIPTION OF PREFERRED EMBODIMENTS (1st Embodiment)

Referring to FIG. 1, a system according to a first embodiment of the present invention has a controller 100 and a memory 200. The controller 100 outputs a clock signal, command signals, and address signals to the memory 200. The controller 100 also outputs and receives data (DQ) signals into/from the memory 200.

The controller 100 is adapted to send out a first data strobe signal and a write data signal in a write operation. The write data signal is synchronized with the first data strobe signal. The controller 100 is also adapted, in a read operation, to send out a second data strobe signal and to receive a read data signal in synchronization with a read data strobe (RDQS) signal. The RDQS signal corresponds to the second data strobe signal.

The memory 200 is adapted to receive the write data signal in synchronization with the first data strobe signal in the write operation. The memory 200 is adapted, in the read operation, to output the read data strobe signal in response to the second data strobe signal and to send out the read data signal synchronized with the read data strobe signal.

In this embodiment, each of the first and the second data strobe signals and the read data strobe signal is independent of and separated from the clock signal. In detail, each of the first and the second data strobe signals and the read data strobe signal has a frequency different from the clock signal, and is not in synchronization with the clock signal in this embodiment.

In the data read operation, the data strobe signal sent out from the controller 100 loopbacks via an interface section (not shown) of the memory 200 and is used as a data reception synchronizing signal at the controller 100.

In the system according to the first embodiment, the write/read operations to/from the memory 200 are controlled by the data strobe signal outputted from the controller 100. The write and the read operations can be carried out without the use of and independently from the clock signal. Therefore, it is not necessary for the memory 200 to produce the data strobe signal from the clock signal nor to make the read data strobe signal synchronize with the clock signal.

Now, description will be made about the system in which the clock signal has a constant and fixed frequency while the data strobe signal has the frequency different from the clock signal.

Figure 2:
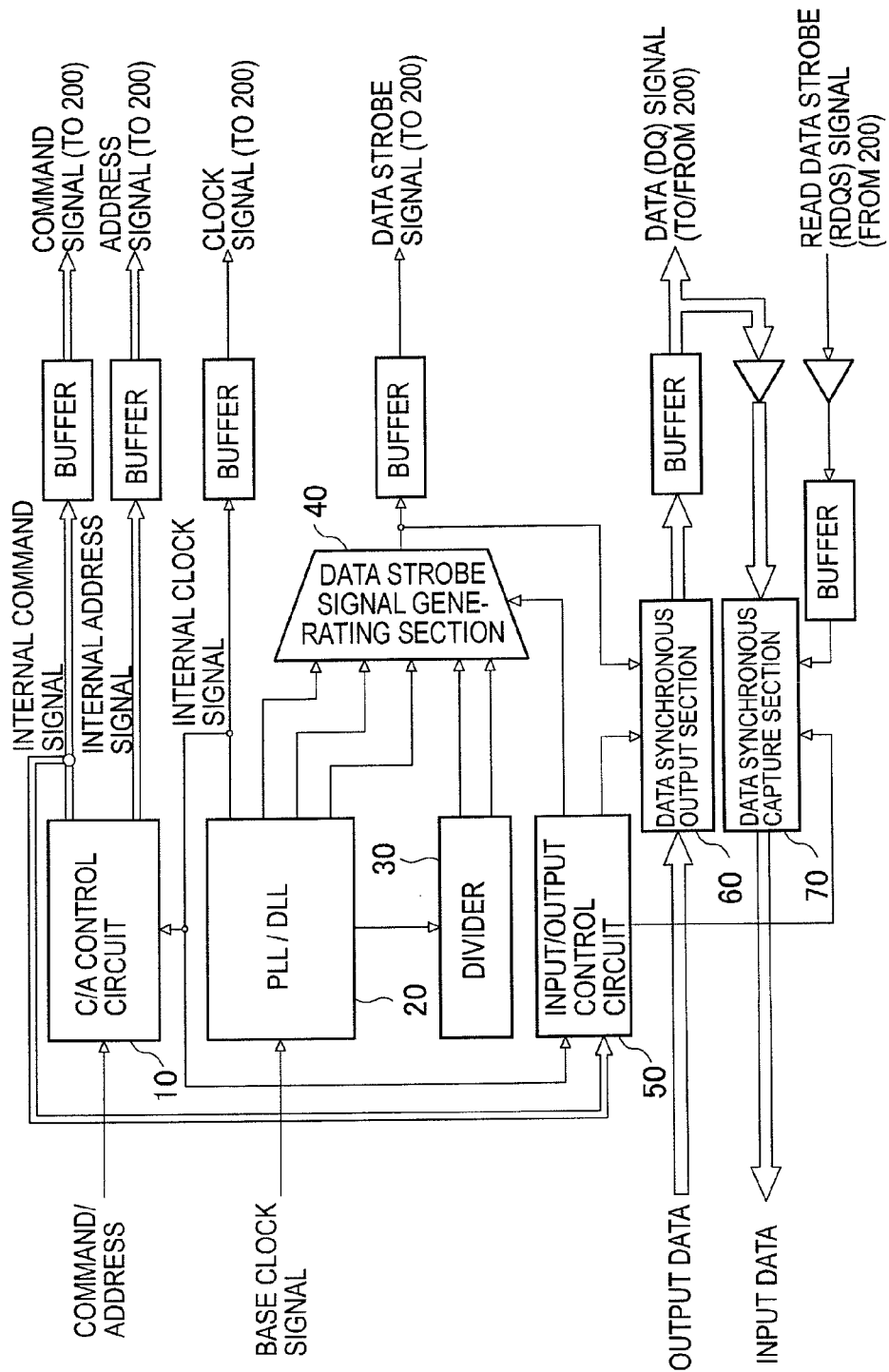
FIG. 2 is a schematic diagram showing a structure of a controller of FIG. 1.

Referring to FIG. 2, the controller 100 according to the first embodiment has a C/A (command/address) control circuit 10, a PLL/DLL 20, a divider 30, a data strobe signal generating section 40, an input/output control circuit 50, a data synchronous output section 60, and a data synchronous capture section 70.

Supplied with command/address outputs, the C/A control circuit 10 generates internal command signals and internal address signals. The internal command signals and the internal address signals are sent to the memory 200 via a buffer as the command signals and the address signals, respectively. In the present embodiment, the internal command signals are also sent to the I/O control circuit 50.

Supplied with a base clock signal, the PLL/DLL circuit 20 generates an internal clock signal and a signal having the frequency at $2^n$ times (n being a positive integer) based on the base clock signal. The divider 30 generates a signal having the frequency at $2^p$ times (p being a negative integer) as the internal clock signal. Each of the PLL/DLL circuit 20 and the divider 30 functions as an intermediate clock signal generator for generating a plurality of intermediate clock signals including the internal clock signals. Each of the plurality of intermediate clock signals has different frequency. In the present embodiment, the intermediate clock signal generator generates the intermediate clock signals each of which has the frequency at $2^m$ times (m being an arbitral integer) as the internal clock signal. The internal clock signal is sent to the memory 200 via the buffer as the clock signal. As shown in FIG. 1, the internal clock signal also functions as an operation clock in the controller 100.

The data strobe signal generating section 40 receives the plurality of intermediate clock signals from the PLL/DLL circuit 20 and the divider 30 and selects one of the intermediate clock signals. Based on the selected intermediate clock signal, the data strobe signal generating section 40 generates an internal data strobe signal under the control of the input/output control circuit 50. The internal data strobe signal is sent out as the data strobe signal to the memory 200 via the buffer. In the present embodiment, the internal data strobe signal is also sent to the data synchronous output section 60.

The input/output control circuit 50 receives the internal command signal and, if the received command is a write command signal, activates the data synchronous output section 60. If the received command is a read command signal, the input/output control circuit 50 activates the data synchronous capture section 70. The input/output control circuit 50 of the present embodiment also outputs a frequency selecting signal to the data strobe signal generating section 40. The frequency selecting signal indicates one of the intermediate clock signals to be selected for use in generating the internal data strobe signal. In the present embodiment, the data strobe signal generating section 40 is a selector which is brought into the activation state for the predetermined period of time while the frequency selecting signals are supplied thereto. The input/output control circuit 50 determines the activation period of the data strobe signal generating section 40, i.e., the period of producing the frequency selecting signals. During the activated period, the data strobe signal generating section 40 outputs the data strobe signal having the predetermined length in consideration of the preamble period. In addition, the input/output control circuit 50 determines a timing to start the activation period of the data strobe signal generating section 40 in consideration of a latency corresponding to the write/read commands.

While being activated under the control of the input/output control circuit 50, the data synchronous output section 60 outputs the data as the DQ signal to the memory 200 via the buffer in synchronization with the internal data strobe signal.

On the other hand, while being activated under the control of the input/output control circuit 50, the data synchronous capture section 70 captures the read data, i.e., the DQ signal in synchronization with the RDQS signal which was sent out from the memory 200.

Figure 3:
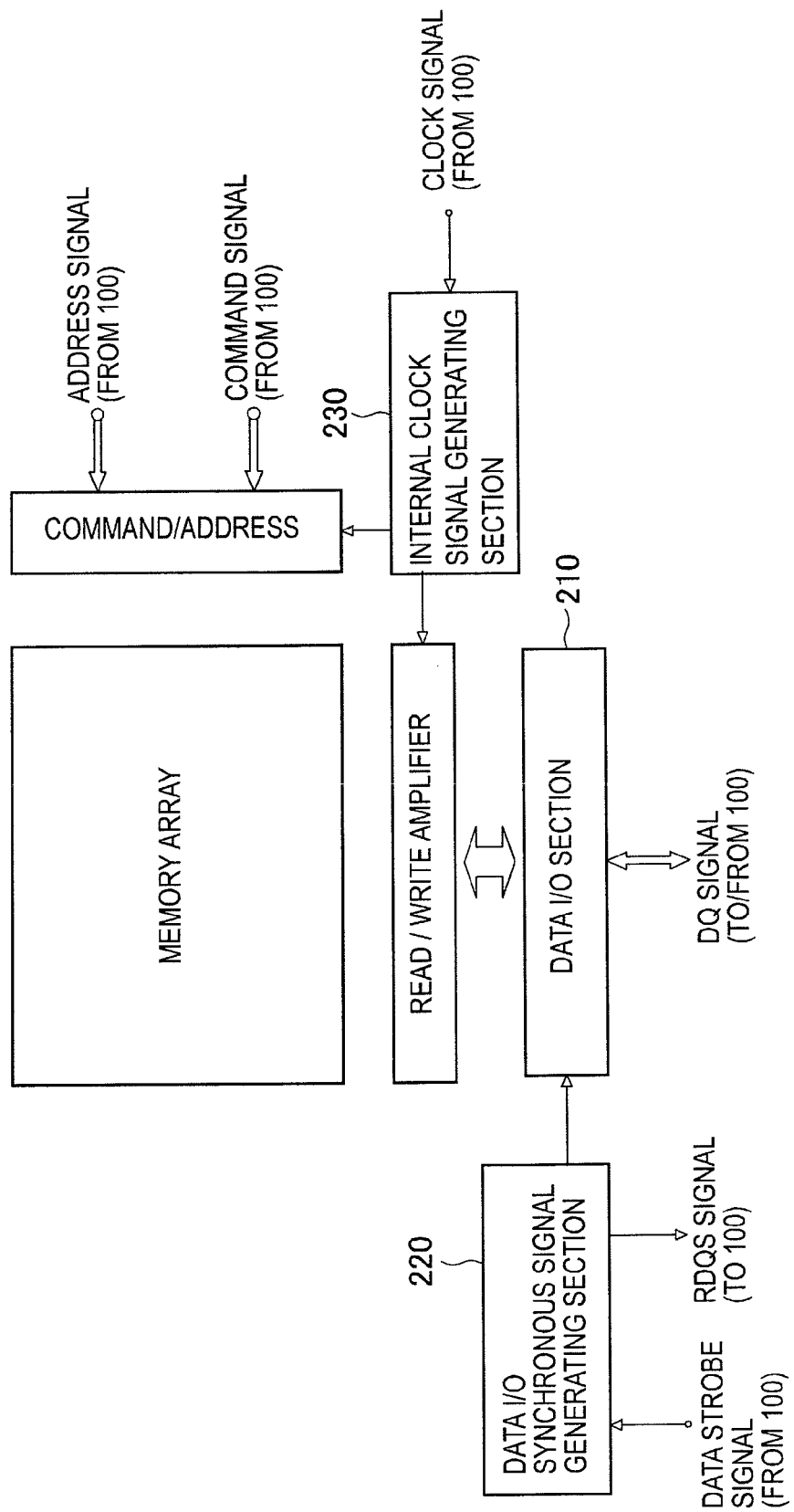
FIG. 3 is a schematic diagram showing a structure of a memory of FIG. 1.

Referring to FIG. 3, the memory 200 according to the first embodiment has at least a data I/O (input/output) section 210, a data I/O synchronous signal generating section 220, and an internal clock signal generating section 230. The data I/O (input/output) section 210 sends and receives the DQ signals between the controller 100. The data I/O synchronous signal generating section 220 generates a synchronous signal for controlling the operation of the data I/O section based on the data strobe signal and generates the RDQS signal from the data strobe signal in the read operation. The internal clock signal generating section 230 generates an internal clock signal upon receiving the clock signal and sends out the internal clock signal to circuits for command/address and so on. As shown in FIG. 3, the input/output operation of the memory 200 is carried out based on the data strobe signal received from the controller 100 and is completely separated from the clock signal.

Figure 4:
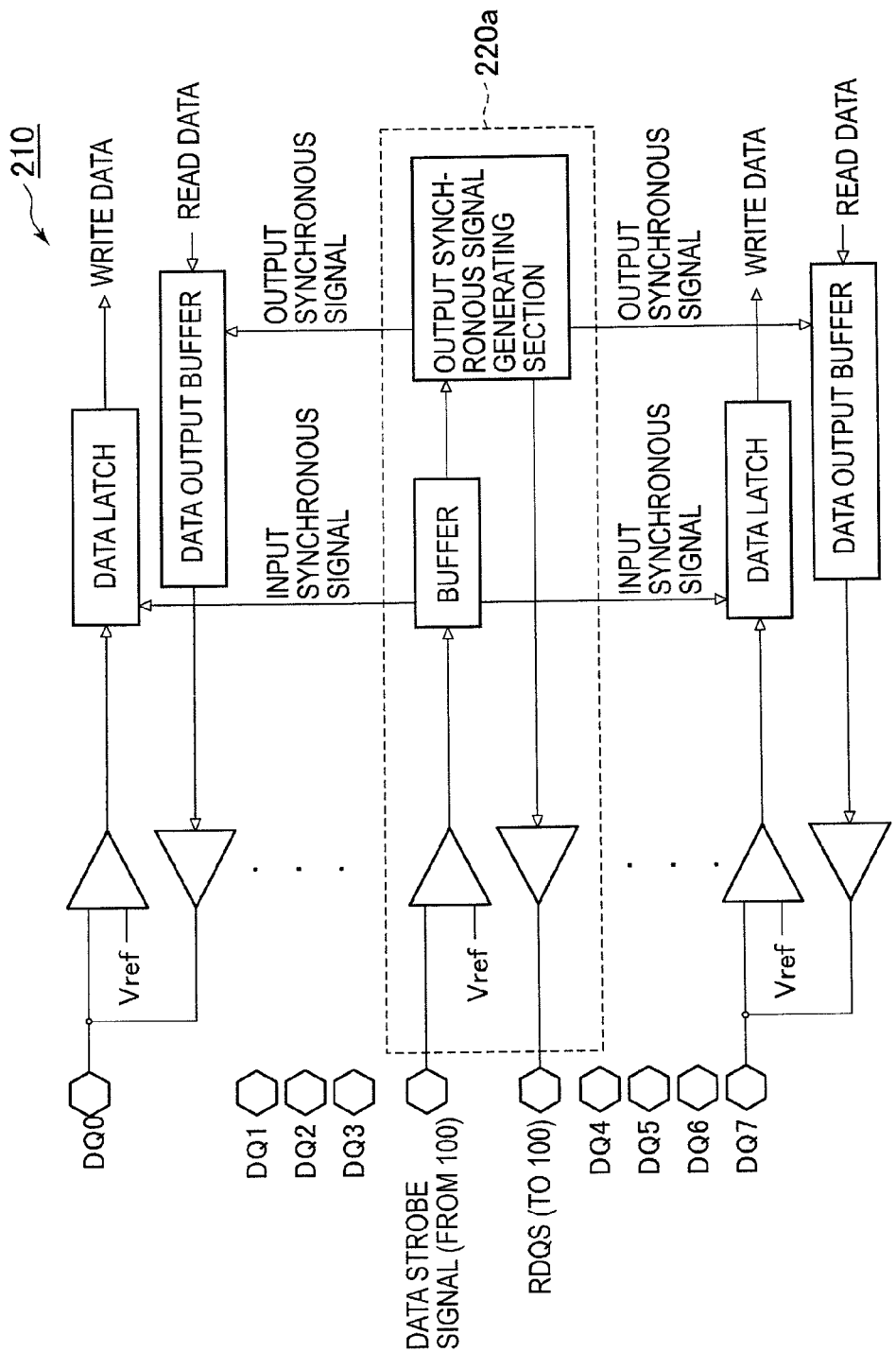
FIG. 4 shows an example of a data I/O (input/output) synchronization signal generating section and a data I/O section of FIG. 3.

FIG. 4 shows the data I/O section 210 and the data I/O synchronous signal generating section 220a applicable to the embodiment of the present invention. The data I/O synchronous signal generating section 220a has the buffer for generating the input synchronous signal from the received data strobe signal and an output synchronous signal generating section for generating the RDQS signal as well as the output synchronous signal from the intermediate synchronous signal from the buffer. The data I/O section 210 has a data latch for latching the DQ signal in synchronization with the input synchronous signal and outputting the same as the write data, and a data output buffer for receiving the read data and outputting the same as the DQ signal in synchronization with the output synchronous signal to the controller 100. In FIG. 4, the data strobe signal and the RDQS signal are transmitted in a single-ended transmission system.

Figure 5:
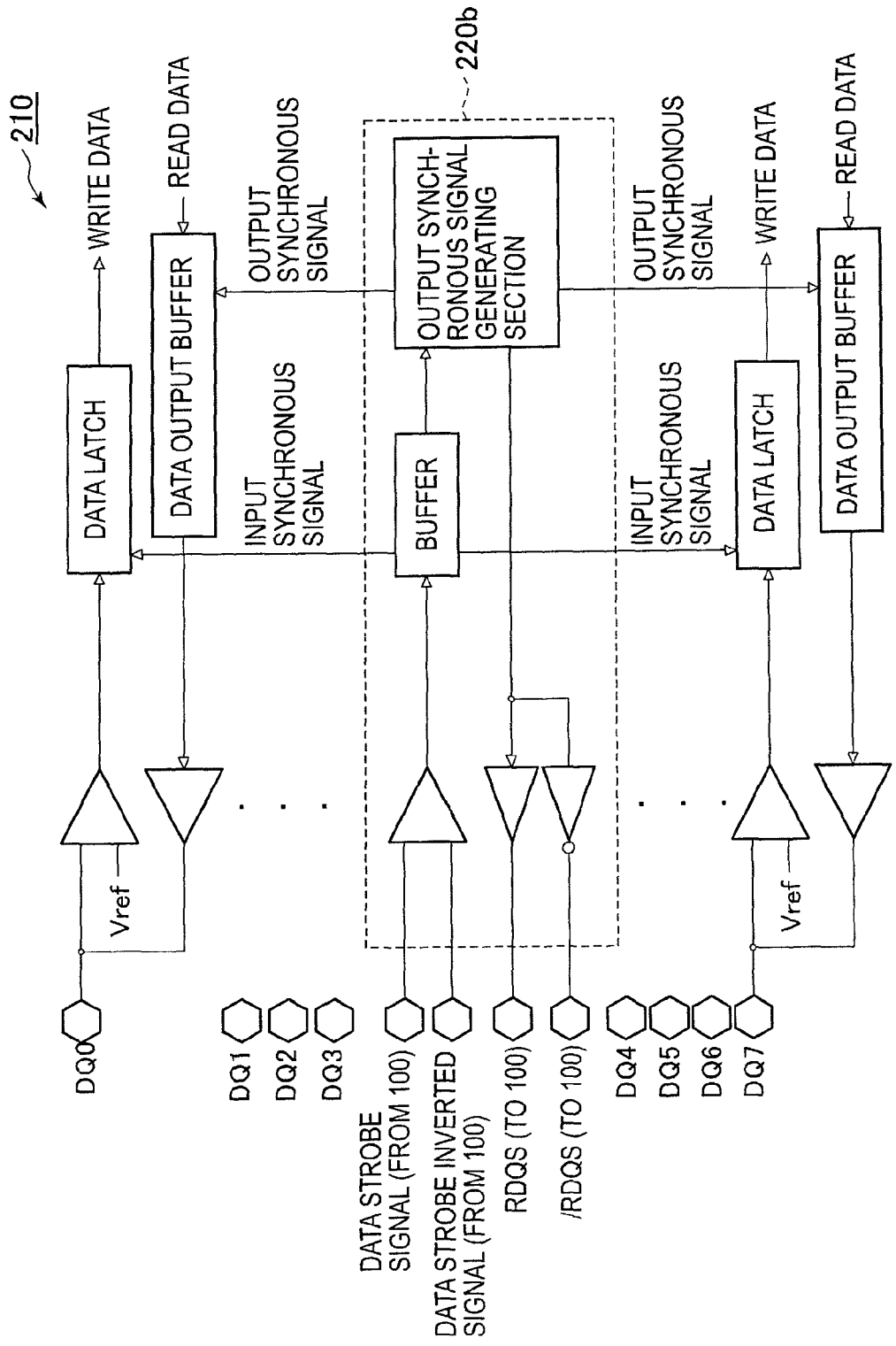
FIG. 5 shows another example of the data I/O synchronization signal generating section and the data I/O section of FIG. 3.

FIG. 5 shows the data input/output (I/O) section 210 and the data I/O synchronous signal generating section 220b applicable to the embodiment of the present invention. According to the example shown in FIG. 5, the data strobe signal and the RDQS signal are transmitted in the differential transmission system. The data I/O synchronous signal generating section 220b has the structure same as the that described above with reference to FIG. 4 except that the structure of the receiver amplifier and the driver are different.

Figure 6:
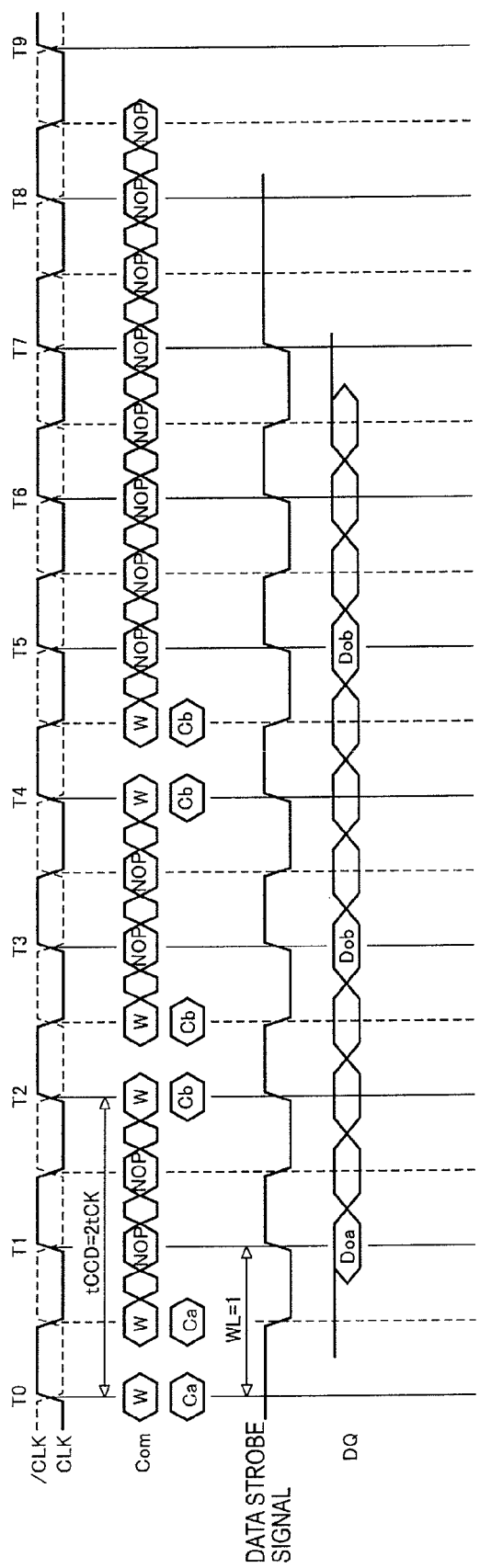
FIG. 6 is an example of a timing chart showing a write operation of the memory in the system of FIG. 1 (double data rate)
Figure 7:
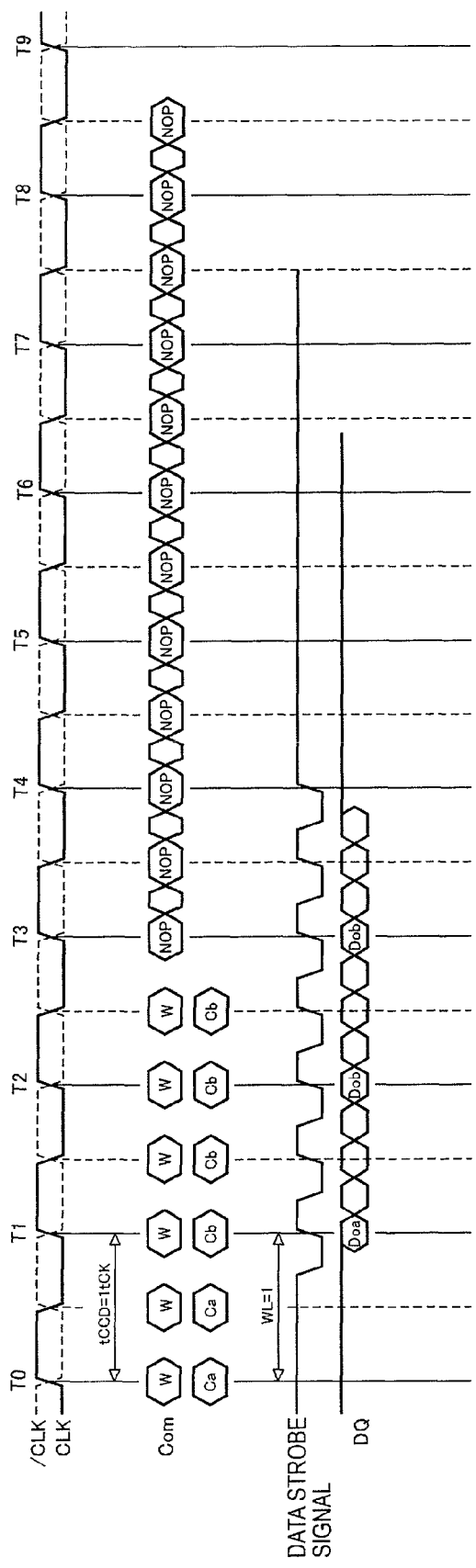
FIG. 7 is another example of a timing chart showing a write operation of the memory in the system of FIG. 1 (quad data rate)
Figure 8:
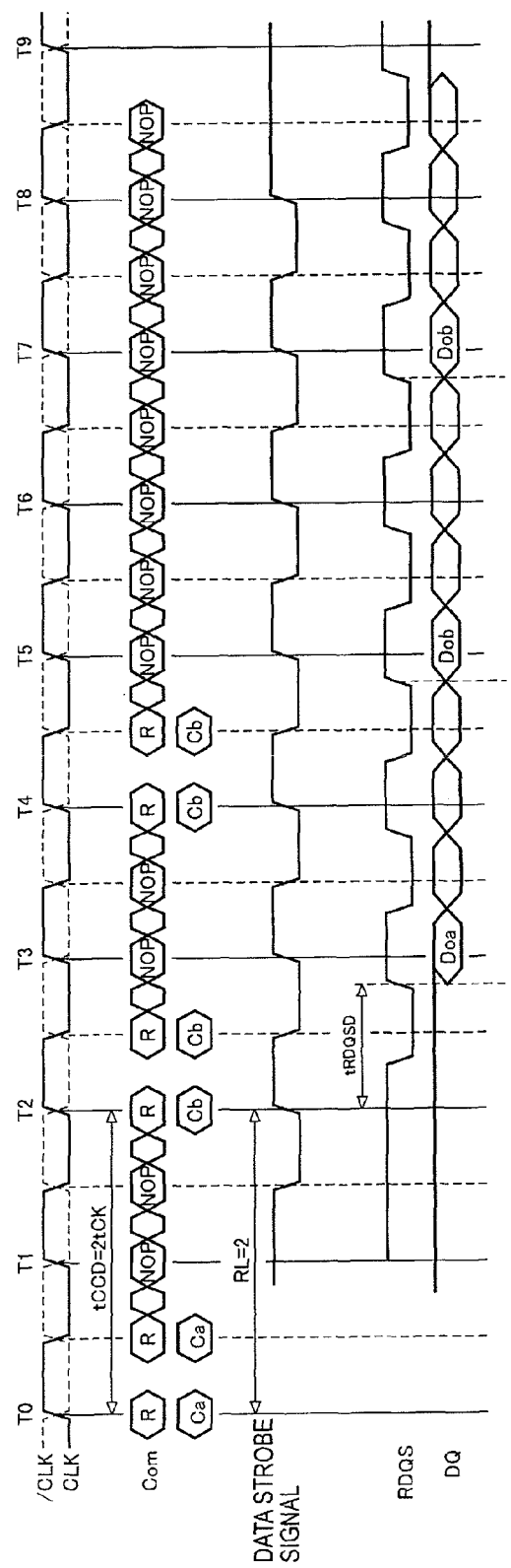
FIG. 8 is an example of a timing chart showing a read operation of the memory in the system of FIG. 1 (double data rate)
Figure 9:
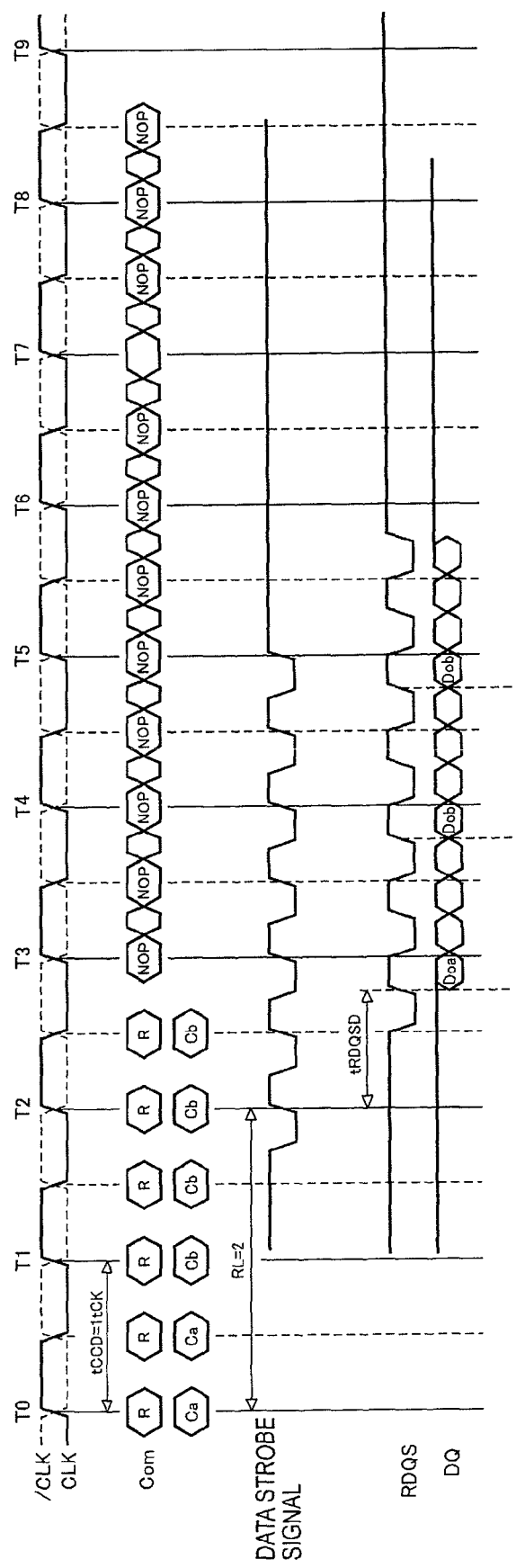
FIG. 9 is another example of a timing chart showing a read operation of the memory in the system of FIG. 1 (quad data rate)

FIGS. 6 to 9 are timing charts showing the operations of the system according to the embodiment of the present invention. FIGS. 6 and 7 are the timing charts showing the write operation of the memory 200 and FIGS. 8 and 9 are the timing charts showing the read operation of the memory 200.

Referring to FIG. 6, the clock signal and the data strobe signal has the same frequencies. Data are captured in synchronization with the rising edge and the falling edge of the data strobe signal. In the example shown in FIG. 6, the data rate of the data strobe signal is twice as the frequency of the clock signal.

Referring to FIG. 7, the data strobe signal has the frequency twice as the frequency of the clock signal. Data are captured in synchronization with the rising edge and the falling edge of the clock signal. In this case, the data rate of the data strobe signal is four times as the frequency of the clock signal. Referring to FIG. 2 together with FIG. 7, the example shown in FIG. 7 can be obtained by generating the data strobe signal based on the intermediate clock signal having the frequency twice as that of the internal clock signal selected by the data strobe signal generating section 40.

Referring to FIG. 8, the clock signal and the data strobe signal has the same frequencies. Data are sent out in synchronization with the rising edge and the falling edge of the data strobe signals. The data rate is twice as the frequency of the clock signal.

Referring to FIG. 9, the data are captured in synchronization with the rising edge and the falling edge of the frequency of the data strobe signal having the frequency twice as that of the clock signal. The data rate is four times as the frequency of the clock signal. Referring to FIG. 2 together with FIG. 9, the example shown in FIG. 9 can be obtained by selecting one of the intermediate clock signals having the frequency twice as that of the internal clock signal and generating the internal data strobe signal based on the selected one of the intermediate clock signals by the data strobe signal generating section 40.

Referring to FIGS. 8 and 9, tRDQSD represents the spontaneous delay amount which is added to the data strobe signal while the data strobe signal is outputted as the RDQS signal via the data I/O synchronous signal generating section 220a (FIG. 4) or 220b (FIG. 5). The delay amount shown in FIGS. 8 and 9 is not a strict delay amount such as the delay replica incorporated in the DLL. In FIGS. 8 and 9, the depiction of the tRDQSD helps it clearly be understood that the DQ signal is synchronized with the RDQS signal but is not synchronized with the clock signals. According to the present embodiment, the DQ signal can be transmitted/received in synchronization with only the data strobe signal. Therefore, the structure of the input/output section of the memory 200 can be simplified.

Figure 10:
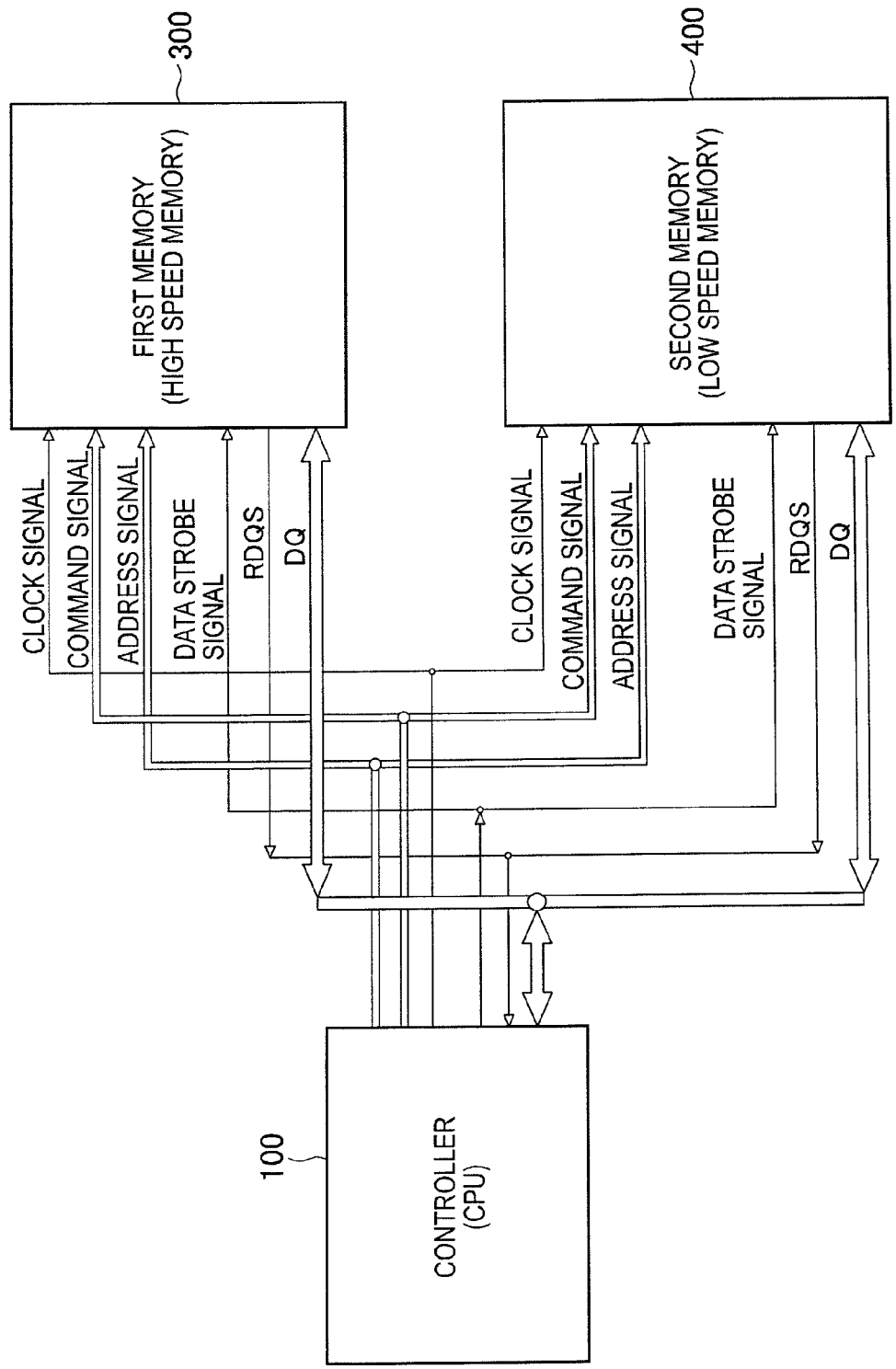
FIG. 10 is a schematic diagram showing an application of the system according to the first embodiment of the present invention.

Next, description will be made about another example of the first embodiment. Referring to FIG. 10, the system has a high speed memory and a low speed memory. Hereinafter the high speed memory is called a first memory 300 and the low speed memory is called a second memory 400. The first memory 300 has the high data rate while the second memory 400 has the low data rate.

According to another example, the controller 100 sends out the clock signal having the clock frequency. The controller 100 also sends out first and second lower data strobe signals as the first and the second data strobe signals for the low speed memory 400 and receives lower read data strobe signal as the read data strobe signal from the low speed memory 400. Each of the first and the second lower data strobe signals and the lower read data strobe signal has a frequency equal to or lower than the clock frequency.

The controller 100 sends out first and second higher data strobe signals as the first and the second data strobe signals for the high speed memory 300 and receives higher read data strobe signal as the read data strobe signal from the high speed memory 300. Each of the first and the second higher data strobe signals and the higher read data strobe signal has a frequency equal to or $2^n$ times (n being an integer) as the clock frequency.

According to the first embodiment, the frequency of the clock signal is fixed and constant while the frequency of the data strobe signal is variable and different from the clock signal. Therefore, both the high speed memory 300 and the low speed memory 400 can be operated by the data strobe signals each having the suitable data rate for each memory.

Figure 11:
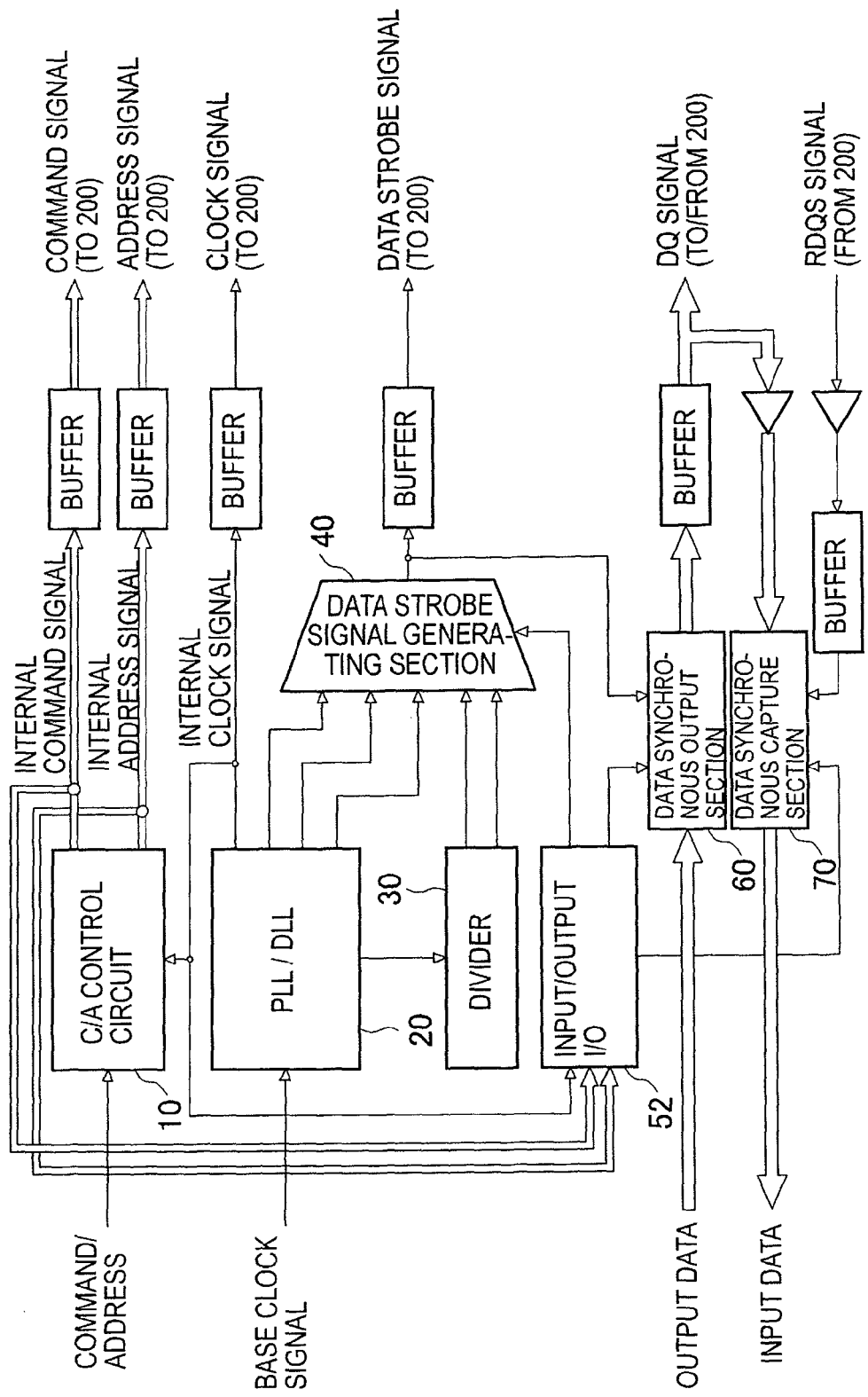
FIG. 11 is a schematic diagram showing a structure of a controller applicable to the system of FIG. 10.

FIG. 11 shows an example of the controller 100 capable of automatically controlling the frequency of the data strobe signal when the first memory 300 and the second memory 400 are distinctly different from each other within an address space. In this case, the frequency of the data strobe signal is automatically controlled depending on the content of the address. In FIG. 11, the same reference numbers are given to the structures same as those illustrated in FIG. 10 and the description therefor will be omitted.

Referring to FIG. 11, the internal address signal outputted from the C/A control circuit is supplied to the input/output control circuit 52. The input/output control circuit 52 receives the internal address signal and judges whether the received signal is designated for the first memory 300 or the second memory 400. Based on the judgment result, the input/output control circuit 52 sends out the frequency selection signal to the data strobe signal generating section 40. The frequency selection signal is used to select the frequency corresponding to the designated memory. According to the first embodiment, the data strobe signal generating section 40 sends out the data strobe signal having the frequency suitable for either the first memory 300 or the second memory 400 under the control of the input/output control circuit 52.

(Second Embodiment)

The system according to the second embodiment of the present invention is a modified example of the first embodiment of the present invention. According to the second embodiment, the frequency of the data strobe signal is fixed and constant while the frequency of the clock signal is variable. The memory 200 of the second embodiment has the same structure as the first embodiment. The controller 100 of the second embodiment has the structure slightly different from the first embodiment. Hereinbelow, the detailed description will be made about the different parts of the structure with reference to FIGS. 12 to 16. In the second embodiment, the same reference numbers are given for the parts those are same as the first embodiment and the description therefor will be omitted.

Figure 12:
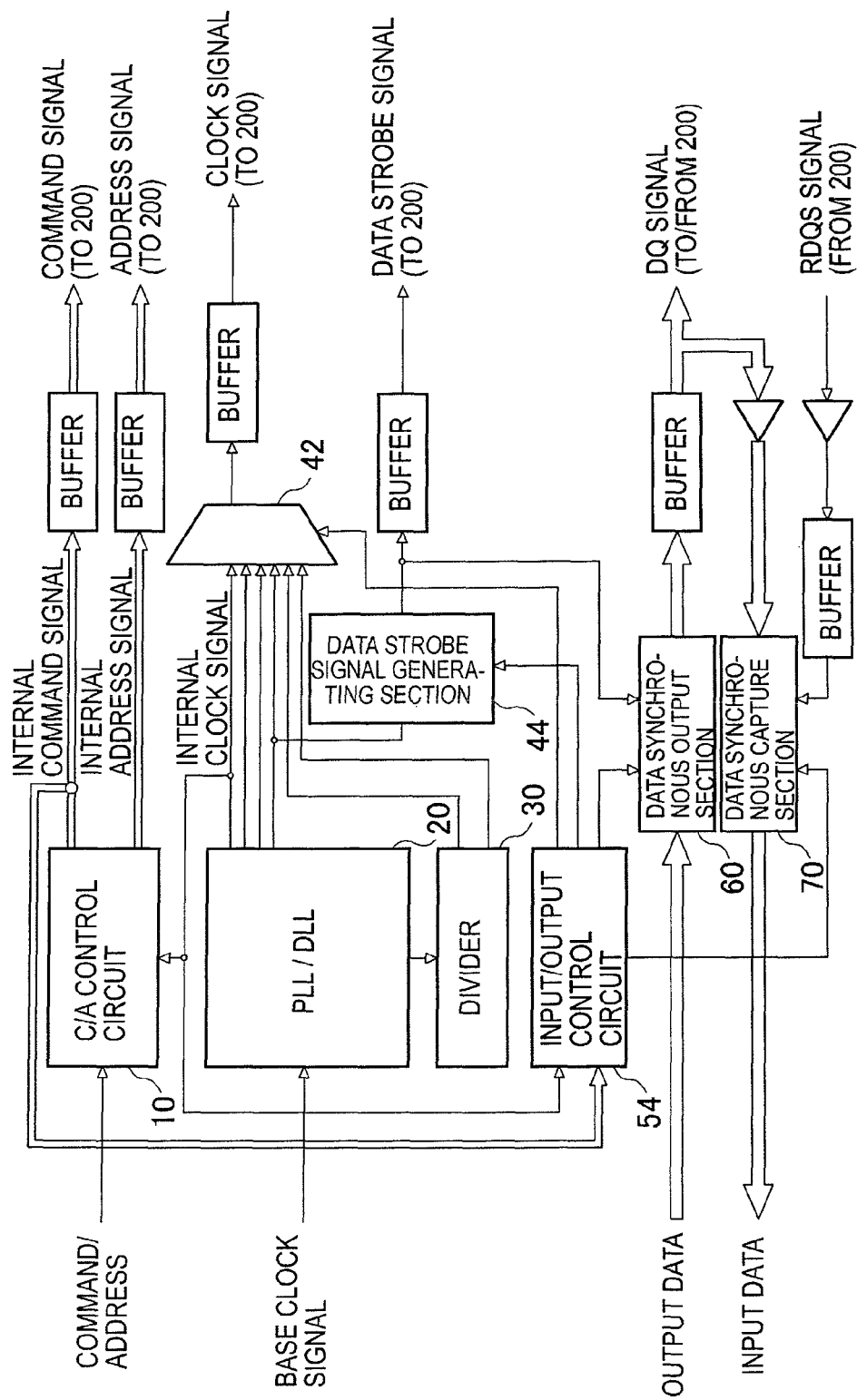
FIG. 12 is a schematic diagram showing a structure of a controller according to a second embodiment of the present invention.

Referring to FIG. 12, the controller according to the second embodiment of the present invention has the C/A control circuit 10, the PLL/DLL 20, the divider 30, a clock signal selecting section 42, the data strobe signal generating section 44, the input/output (I/O) control circuit 54, the data synchronous output section 60, and the data synchronous capture section 70.

Under the control of the I/O control circuit 54, the clock signal selecting section 42 selects one of the plurality of intermediate clock signals outputted from the PLL/DLL 20 and the divider 30. The clock signal selecting section 42 outputs the selected intermediate clock signal as the clock signal to the memory 200 via the buffer.

The data strobe signal generating section 44 receives a specific one of the plurality of intermediate clock signals outputted from the PLL/DLL 20 and the divider 30. Under the control of the I/O control circuit 54, the data strobe signal generating section 44 generates the internal data strobe signal based on the received intermediate clock signal and sends out the same as the data strobe signal to the memory 200 via the buffer.

The I/O control circuit 54 outputs the frequency selecting signal to the clock signal selecting section 42. The frequency selecting signal is indicative of the signal to be selected among the intermediate clock signals. The I/O control circuit 54 also outputs an activation signal to the data strobe signal generating section 44. The activation signal activates the data strobe signal generating section 44 for a certain and suitable period of time in consideration of the latency corresponding to the write/read command. The input/output control circuit 54 controls the data synchronous output section 60 and the data synchronous capture section 70 in the manner same as the first embodiment.

FIGS. 13 to 16 show the operation timing charts of the memory 200 of the system according to the present embodiment.

Figure 13:
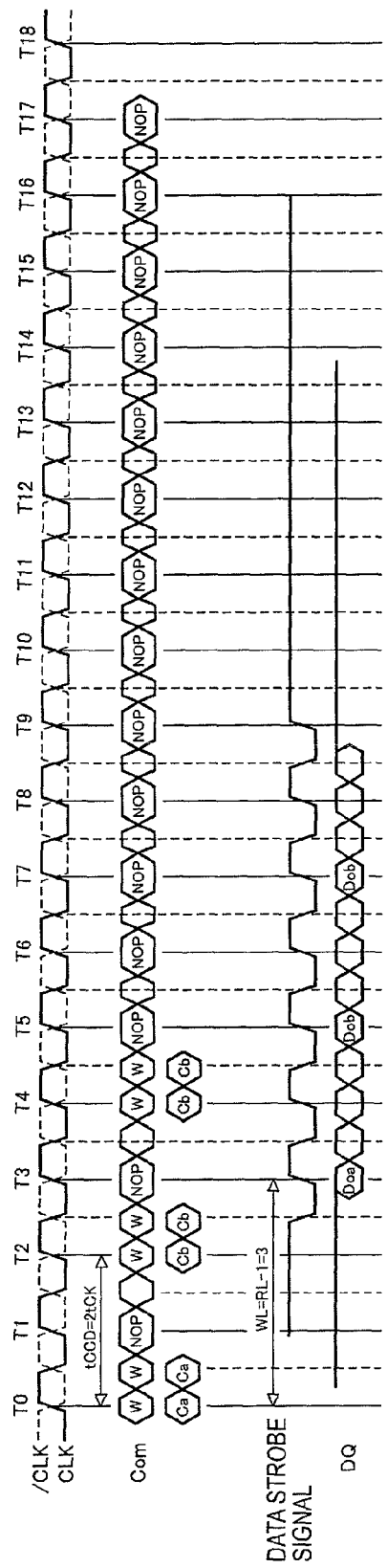
FIG. 13 is an example of a timing chart showing a write operation of the memory in the system according to the second embodiment (double data rate)
Figure 14:
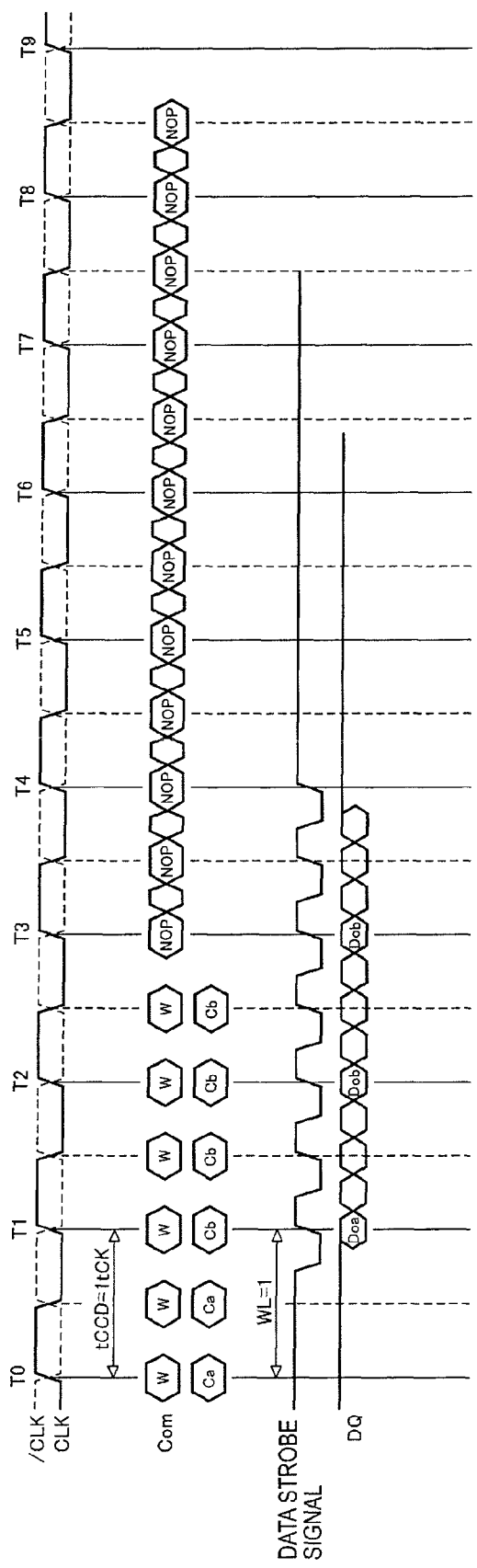
FIG. 14 is another example of a timing chart showing a write operation of the memory in the system according to the second embodiment (quad data rate)

FIGS. 13 and 14 show the timing charts of the data write operation. Referring to FIG. 13, the frequency of the clock signal and the data strobe signal are the same. The data rate of the data strobe signal is twice as the frequency of the clock signal. Referring to FIG. 14, the frequency of the clock signal is ½ times as the frequency of the data strobe signal. The data rate of the data strobe signal is four times as the frequency of the clock signal.

Figure 15:
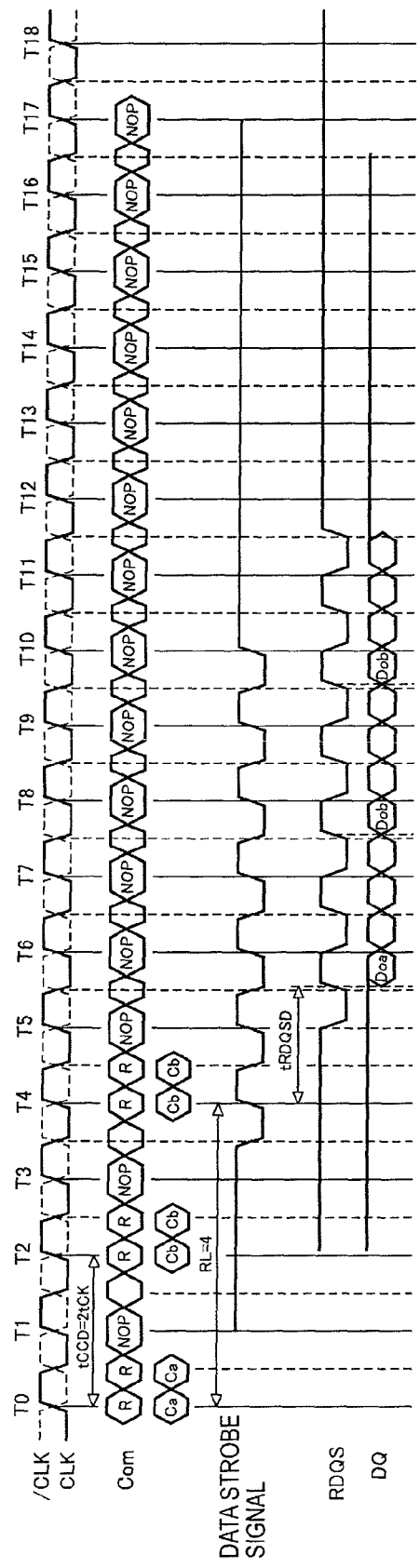
FIG. 15 is an example of a timing chart showing a read operation of the memory in the system according to the second embodiment (double data rate)
Figure 16:
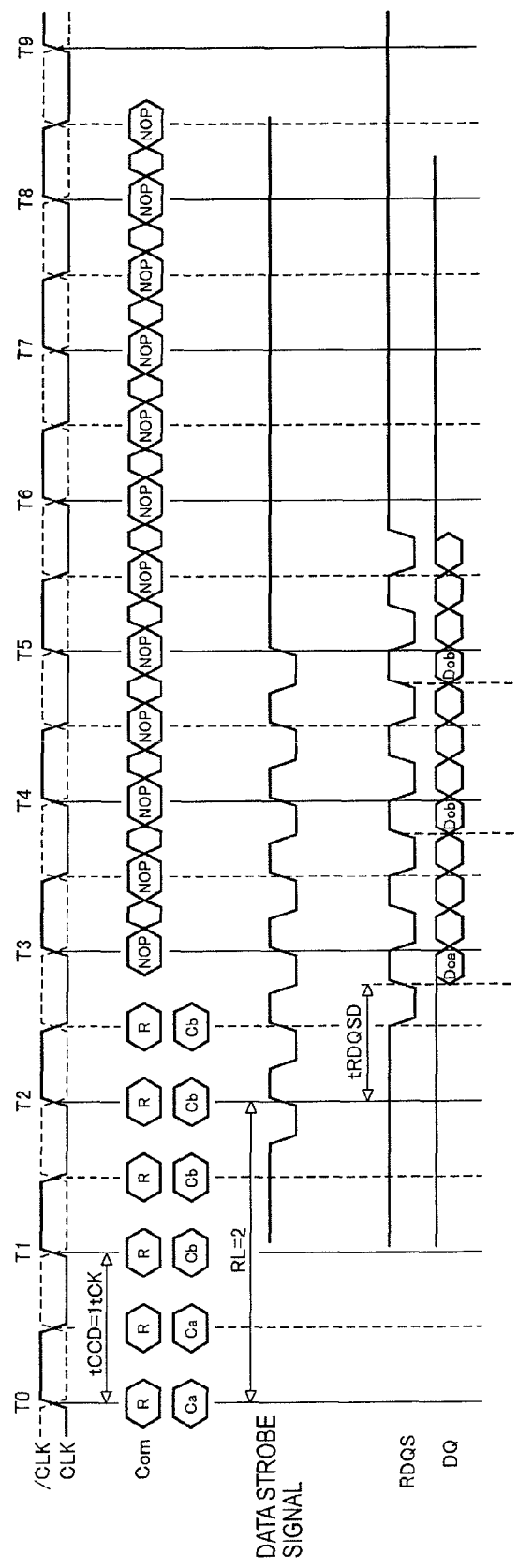
FIG. 16 is another example of a timing chart showing a read operation of the memory in the system according to the second embodiment (quad data rate).

FIGS. 15 and 16 show the timing charts of the data read operation. Referring to FIG. 15, the frequency of the clock signal and the data strobe signal are the same. The data rate of the data strobe signal is twice as the frequency of the clock signal. Referring to FIG. 16, the frequency of the clock signal is ½ times as the frequency of the data strobe signal. The data rate of the data strobe signal is four times as the frequency of the clock signal.

The present application is based on Japanese patent applications of JP2006-160204 filed before the Japan Patent Office on Jun. 8, 2006, the contents of which are incorporated herein by reference.

While there has been described what is believed to be the preferred embodiment of the invention, those skilled in the art will recognize that other and further modifications may be made thereto without departing from the spirit of the invention, and it is intended to claim all such embodiments that fall within the true scope of the invention.

What is claimed is:

1. A method comprising:
    producing a first signal at a first terminal and a write data signal at a third terminal in a write operation, the write data signal being synchronized with the first signal;
    producing a second signal at the first terminal;
    receiving a read data signal at the third terminal in synchronization with a third signal arriving at a second terminal in a read operation; and
    producing a clock signal at a fourth terminal in each of the read and write operations,
    wherein each of the first, second and third signals is not in synchronization with the clock signal.

2. The method according to claim 1, wherein each of the first, second and third signals has a frequency different from the clock signal.

3. The method according to claim 1, wherein each of the first, second and third signals has a frequency substantially twice as large as a frequency of the clock signal.

4. A method comprising:
    generating a first signal based on a clock signal;
    outputting the first signal to a first terminal;
    generating a second signal based on the clock signal;
    outputting the second signal to a second terminal;
    generating a command signal in synchronization with the first signal;
    outputting the command signal to a third terminal;
    generating a first data signal in synchronization with the second signal;
    outputting the first data signal to a fourth terminal; and
    receiving a second data signal at the fourth terminal in synchronization with a third signal arriving at a fifth terminal, the third signal arriving at the fifth terminal in response to the outputting the second signal to the second terminal.

5. The method according to claim 4, further comprising:
    generating an address signal in synchronization with the first signal; and
    outputting the address signal to a six terminal.

6. The method according to claim 4, wherein the first signal has a different frequency from the clock signal.

7. The method according to claim 4, wherein the second signal has a different frequency from the clock signal.

8. A method comprising:
    generating a write data signal at a first terminal during clocking a second terminal,
    receiving a read data signal at the first terminal during clocking a third terminal and during clocking the second terminal, wherein the clocking for the second and third terminals is not in synchronization with a signal clocking a fourth terminal.

9. The method according to claim 8, further comprising:

generating the write data at the first terminal during clocking the second terminal and while the third terminal is being free from clocking.

10. A method comprising:

generating a write data signal at a first terminal during clocking a second terminal, receiving a read data signal at the first terminal during clocking a third terminal and during clocking the second terminal, wherein the clocking the second terminal being performed at a first frequency, the method further comprising clocking a fourth terminal with a second frequency which is different from the first frequency.

11. The method according to claim 10, further comprising outputting a different signal from each of the read and write data signals from a fifth terminal during clocking the fourth terminal.

12. The method according to claim 10, wherein the first frequency is larger than the second frequency.

13. The method according to claim 11, wherein the different signal is a command signal.

14. The method according to claim 11, wherein the different signal is an address signal.

* * * * *